(12) United States Patent
Hayashi

(10) Patent No.: US 12,063,031 B2
(45) Date of Patent: Aug. 13, 2024

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Tsuneyuki Hayashi, Tokyo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 400 days.

(21) Appl. No.: 17/469,813

(22) Filed: Sep. 8, 2021

(65) Prior Publication Data

US 2022/0173586 A1 Jun. 2, 2022

(30) Foreign Application Priority Data

Dec. 1, 2020 (JP) .................. 2020-199676

(51) Int. Cl.
| | |
|---|---|
| *H03K 17/0812* | (2006.01) |
| *H02H 1/00* | (2006.01) |
| *H02H 3/24* | (2006.01) |
| *H03K 17/687* | (2006.01) |
| *H03K 19/20* | (2006.01) |

(52) U.S. Cl.
CPC ..... *H03K 17/08122* (2013.01); *H02H 1/0007* (2013.01); *H02H 3/24* (2013.01); *H03K 17/6871* (2013.01); *H03K 19/20* (2013.01)

(58) Field of Classification Search
CPC ......... H03K 17/08122; H03K 17/6871; H03K 19/20; H03K 2217/0081; H02H 1/0007; H02H 3/24

USPC .......................................................... 361/86
See application file for complete search history.

(56) References Cited

U.S. PATENT DOCUMENTS

| | | |
|---|---|---|
| 9,729,150 B2 | 8/2017 | Ishimatsu et al. |
| 2007/0139841 A1* | 6/2007 | Ohshima ............... H03K 17/18 |
| | | 361/100 |
| 2019/0296730 A1 | 9/2019 | Ogura et al. |

FOREIGN PATENT DOCUMENTS

| | | | |
|---|---|---|---|
| JP | H05-38134 A | | 2/1993 |
| JP | 2007-174756 A | | 7/2007 |
| JP | 2011-166593 A | | 8/2011 |
| JP | 2011166593 A | * | 8/2011 |
| JP | 2014-217156 A | | 11/2014 |
| JP | 2019-080359 A | | 5/2019 |

(Continued)

OTHER PUBLICATIONS

Machine translation of Serizawa Japanese Patent Document JP 2011-166593 A Feb. 2010 (Year: 2010).*

*Primary Examiner* — Kevin J Comber
(74) *Attorney, Agent, or Firm* — Kim & Stewart LLP

(57) ABSTRACT

According to one embodiment, a semiconductor device includes a first circuit configured to generate a first voltage, a second circuit configured to transfer the generated first voltage to a first terminal, and a third circuit configured to generate a first signal that demonstrates a first level when a voltage at the first terminal is higher than or equal to a threshold voltage, and a second level when the voltage of the first terminal is lower than the threshold voltage, wherein the second circuit is configured to interrupt transfer of the first voltage, based on the first signal at the second level.

11 Claims, 10 Drawing Sheets

(56) References Cited

FOREIGN PATENT DOCUMENTS

JP 2019-169825 A 10/2019

\* cited by examiner

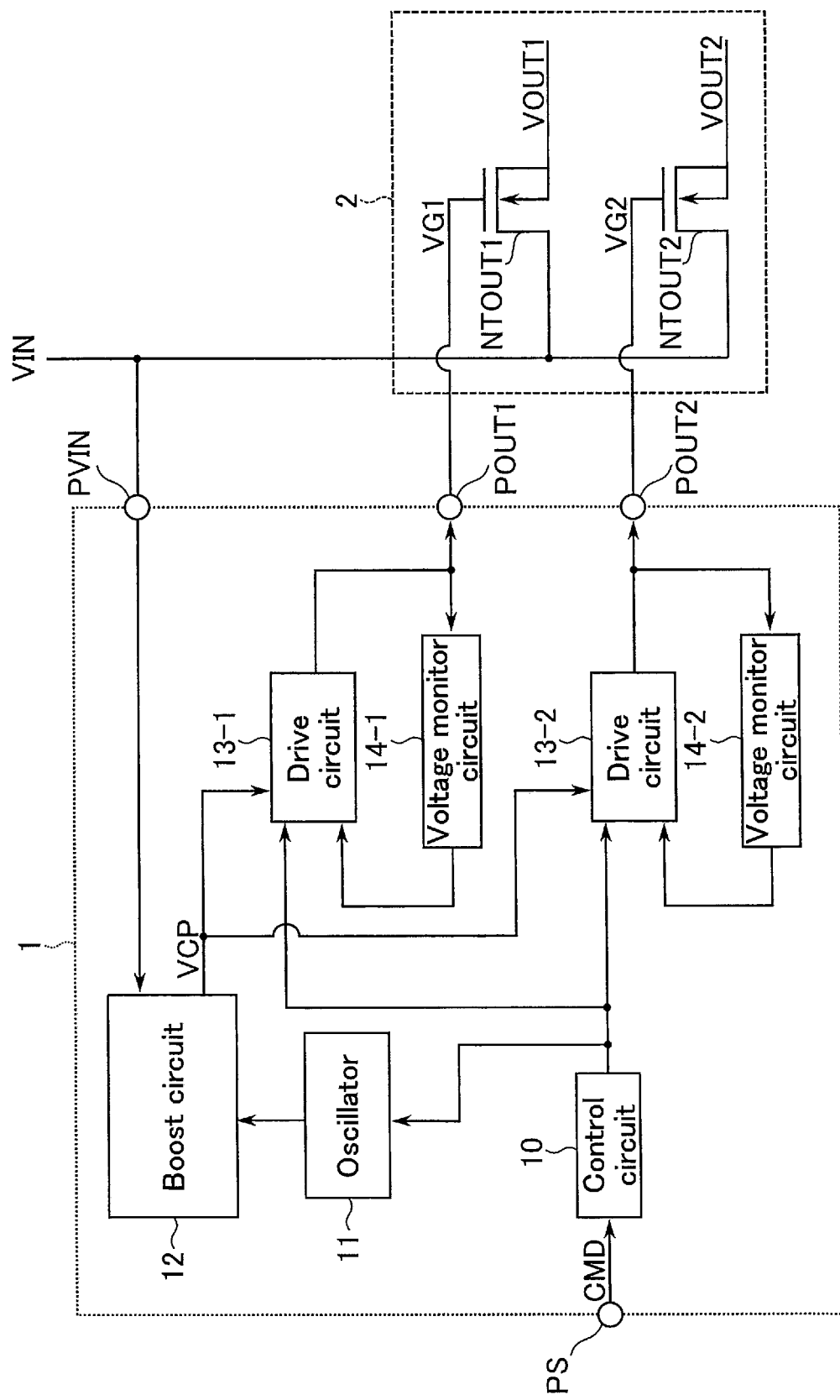
F I G. 1

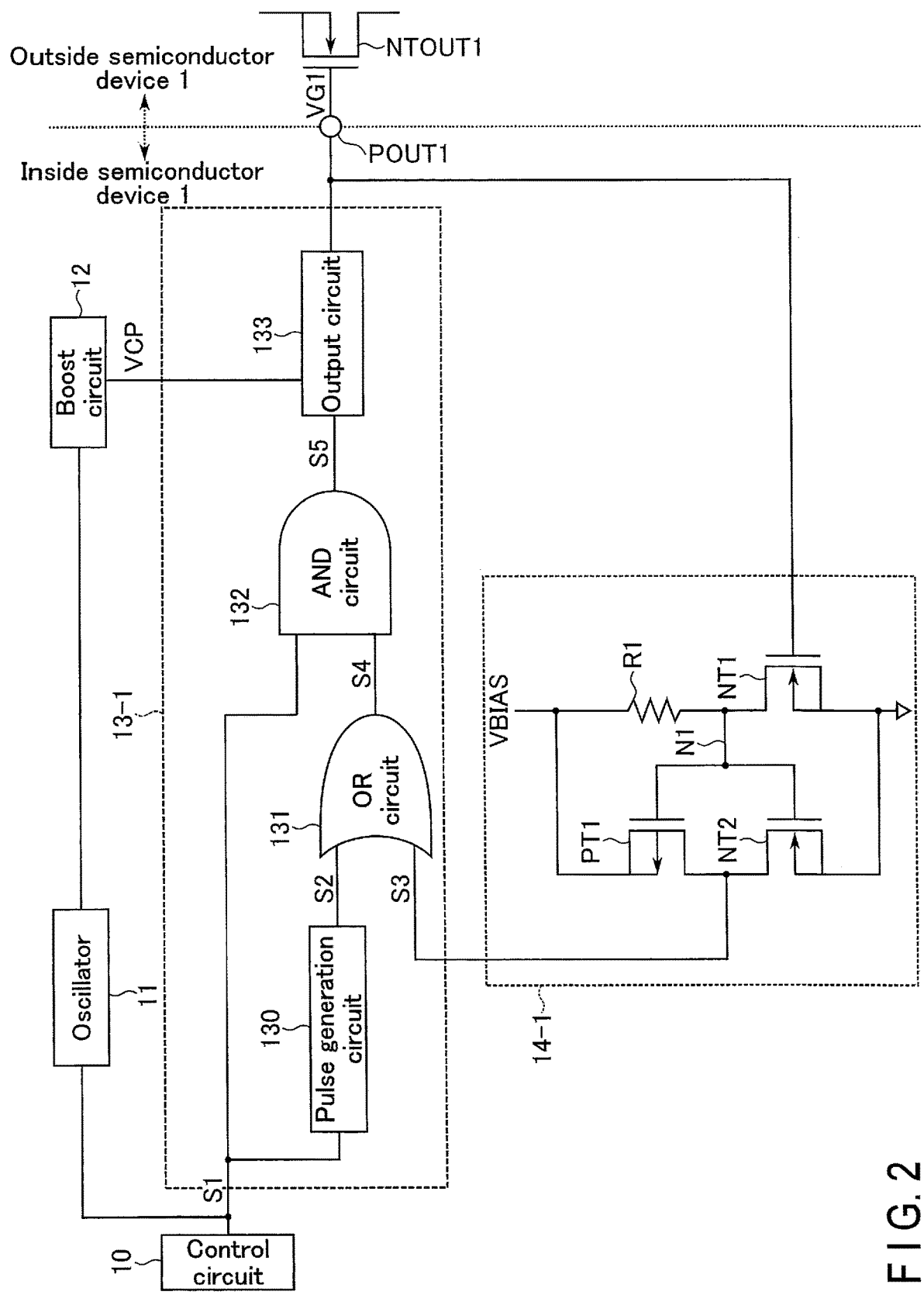
F I G. 2

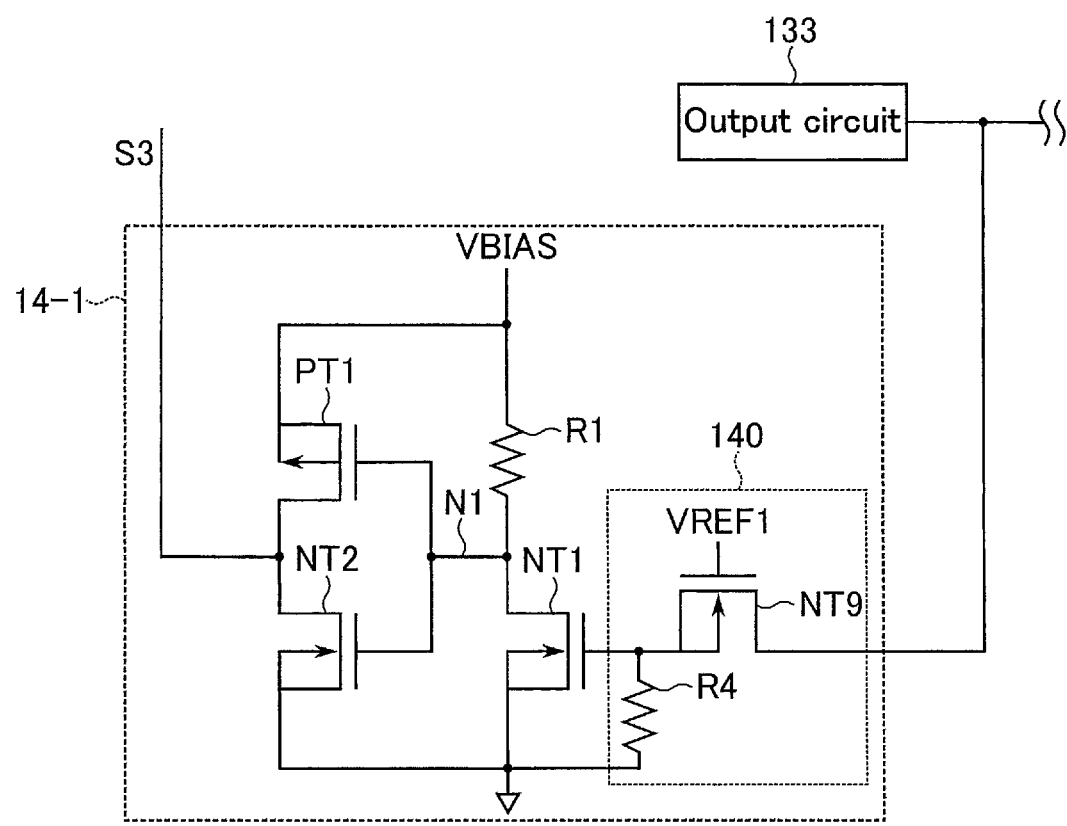
F I G. 5

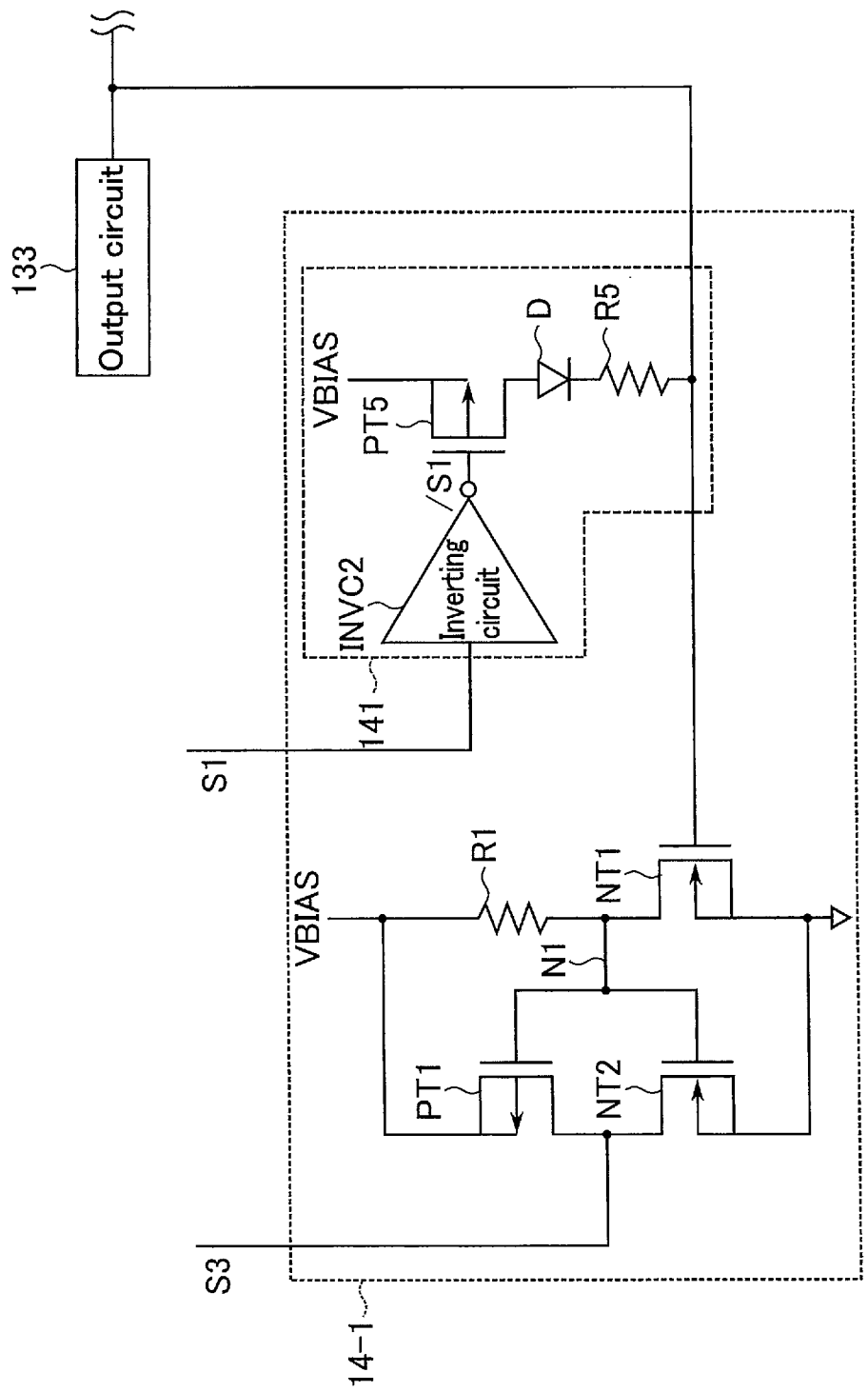
F I G. 8

US 12,063,031 B2

SEMICONDUCTOR DEVICE

CROSS-REFERENCE TO RELATED APPLICATIONS

This application is based upon and claims the benefit of priority from Japanese Patent Application No. 2020-199676, filed Dec. 1, 2020, the entire contents of which are incorporated herein by reference.

FIELD

Embodiments described herein relate generally to a semiconductor device.

BACKGROUND

Semiconductor devices for supplying a voltages to loads have been known.

BRIEF DESCRIPTION OF THE DRAWINGS

FIG. 1 is a block diagram for explaining an exemplary configuration of a semiconductor device according to an embodiment.

FIG. 2 is a circuit diagram for explaining an exemplary configuration of a drive circuit and a voltage monitor circuit of the semiconductor device according to the present embodiment.

FIG. 5 is a circuit diagram for explaining an exemplary configuration of a voltage monitor circuit of a semiconductor device according to a first modification example.

FIG. 8 is a circuit diagram for explaining an exemplary configuration of a voltage monitor circuit of a semiconductor device according to a third modification example.

DETAILED DESCRIPTION

Figure 3:
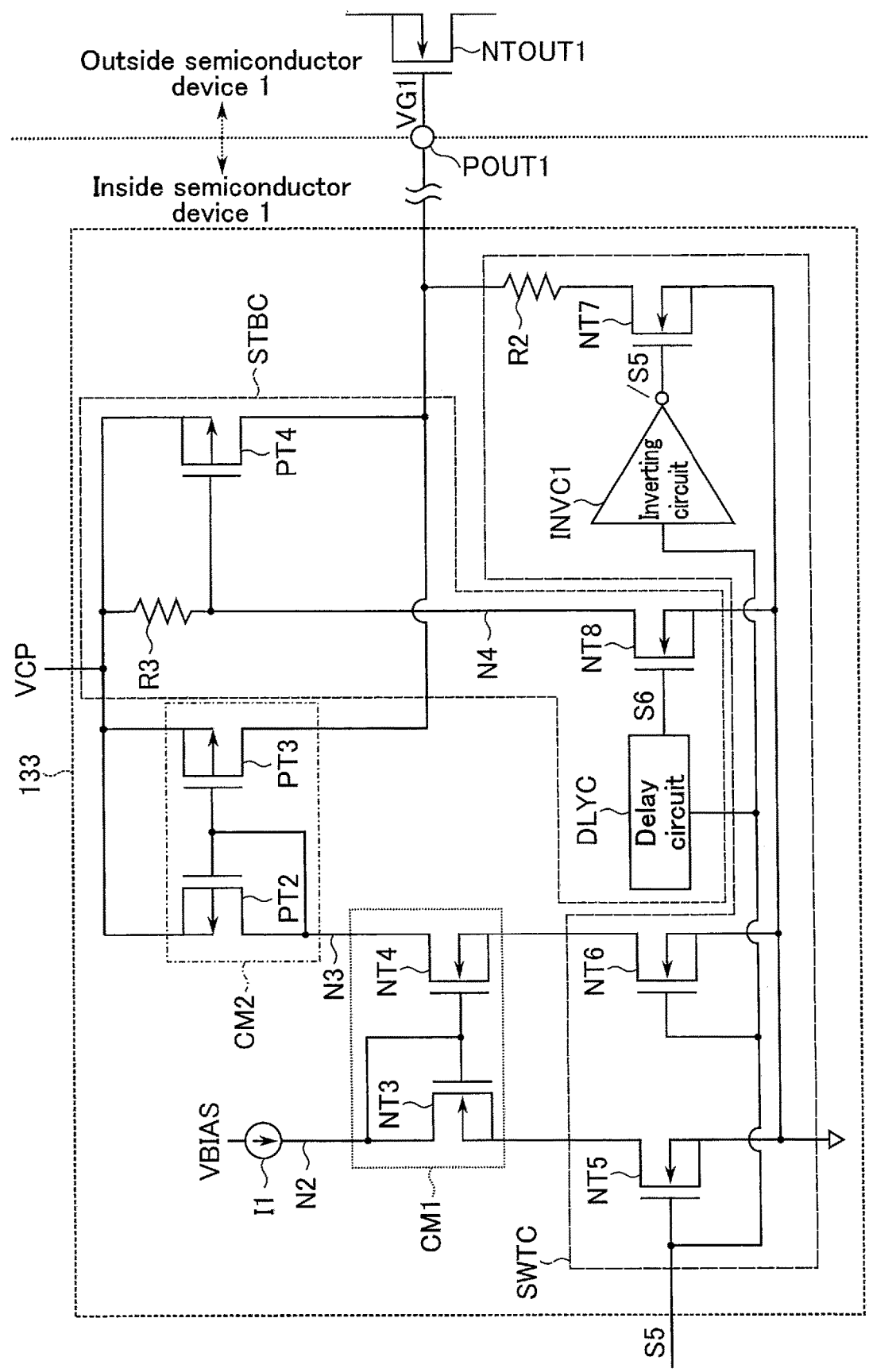
FIG. 3 is a circuit diagram for explaining an exemplary configuration of an output circuit included in a drive circuit of the semiconductor device according to the present embodiment.

In general, according to one embodiment, a semiconductor device includes a first circuit configured to generate a first voltage, a second circuit configured to transfer the generated first voltage to a first terminal, and a third circuit configured to generate a first signal that demonstrates a first level when a voltage at the first terminal is higher than or equal to a threshold voltage, and a second level when the voltage of the first terminal is lower than the threshold voltage, wherein the second circuit is configured to interrupt transfer of the first voltage, based on the first signal at the second level.

The embodiments will be explained below by referring to the drawings. In the following explanation, components having the same functions and configurations will be referred to by the same reference symbol.

1. EMBODIMENT

A semiconductor device according to the present embodiment will be described below.

The semiconductor device according to the present embodiment is a driver configured to supply voltages for driving loads such as switch elements. Examples of the semiconductor device according to the present embodiment include an integrated circuit (IC) chip.

1.1 Configuration

The configuration of the semiconductor device according to the present embodiment will be described.

1.1.1 Overall Configuration of Semiconductor Device

The configuration of the semiconductor device according to the present embodiment will be explained with reference to FIG. 1, which is a block diagram showing an exemplary configuration of a semiconductor device according to the present embodiment.

A semiconductor device 1 is configured to supply to a switch 2 external to the semiconductor device 1 a voltage for driving the switch 2.

The switch 2 may include two switch elements NTOUT (NTOUT1 and NTOUT2). A switch element NTOUT is an N-channel metal-oxide-semiconductor field effect transistor (MOSFET). In the example of FIG. 1, the switch 2 includes two switch elements NTOUT1 and NTOUT2; however, the number of switch elements NTOUT is not limited thereto. The switch 2 may include only one switch element, or three or more switch elements.

A voltage VIN is input to a first end of each of the switch elements NTOUT1 and NTOUT2. The voltage VIN is a voltage supplied from a source of voltage external to the semiconductor device 1. The external source of voltage supplies a voltage VIN to the first end of the switch elements NTOUT, for example via a universal serial bus (USB) terminal of a portable electronic apparatus. The gate of each of the switch elements NTOUT1 and NTOUT2 is coupled to the semiconductor device 1, as described later. Voltage VOUT1 is output from the second end of the switch element NTOUT1, while voltage VOUT2 is output from the second end of the switch element NTOUT2. The voltages VOUT1 and VOUT2 are supplied to loads (not shown) that differ from each other. Examples of the loads may include a battery, a power supply IC, or the like.

The semiconductor device 1 includes terminals PVIN, POUT1, POUT2, and PS.

A voltage VIN is input to the terminal PVIN.

The terminal POUT1 couples the semiconductor device 1 to the gate of the switch element NTOUT1. The terminal POUT2 couples the semiconductor device 1 to the gate of the switch element NTOUT2. From the terminals POUT1 and POUT2, voltages are output to charge the gates of the switch elements NTOUT1 and NTOUT2, respectively.

The terminal PS receives a command CMD, for example from outside of the semiconductor device 1. A command CMD may include a command for causing the semiconductor device 1 to drive the switch 2 and a command for causing the semiconductor device 1 to stop driving the switch 2. In response to the received command CMD, the semiconductor device 1 drives the switch 2.

The semiconductor device 1 includes a control circuit 10, an oscillator 11, a boost circuit 12, a drive circuit 13, and a voltage monitor circuit 14. The drive circuit 13 includes drive circuits 13-1 and 13-2. The voltage monitor circuit 14 includes voltage monitor circuits 14-1 and 14-2. In the example described below, the semiconductor device 1 contains two drive circuits 13 and two voltage monitor circuits 14, which is not a limitation. The semiconductor device 1 may include a single drive circuit 13 and a single voltage monitor circuit 14, or three or more of each of the circuits, in accordance with the number of switch elements NTOUT included in the switch 2.

The control circuit 10 receives a command CMD from outside of the semiconductor device 1, for example via the terminal PS, and controls the oscillator 11 and boost circuit 12 based on the received command CMD.

The oscillator 11 generates a clock signal under the control of the control circuit 10, and outputs the generated clock signal to the boost circuit 12.

To the boost circuit 12, a voltage VIN is input via the terminal PVIN from the outside of the semiconductor device 1. The boost circuit 12 boosts the input voltage VIN to a voltage VCP, and outputs the resultant voltage based on the clock signal of the oscillator 11. The voltage VCP of the boost circuit 12 is used for driving the switch 2. Hereinafter, the operation of the boost circuit 12 for boosting the voltage VIN to the voltage VCP and outputting the boosted voltage will be referred to as a boosting operation.

A voltage VCP of the boost circuit 12 is input to each of the drive circuits 13-1 and 13-2. The drive circuits 13-1 and 13-2 drive the switch 2, using the input voltage VCP of the boost circuit 12. More specifically, the drive circuit 13-1 transfers the voltage VCP of the boost circuit 12 to the gate of the switch element NTOUT1 via the terminal POUT1, under the control of the control circuit 10 and voltage monitor circuit 14-1. The drive circuit 13-1 thereby charges the gate of the switch element NTOUT1, and drives the switch element NTOUT1. The drive circuit 13-2 transfers the voltage VCP of the boost circuit 12 to the gate of the switch element NTOUT2 via the terminal POUT2 under the control of the control circuit 10 and the voltage monitor circuit 14-2. The drive circuit 13-2 thereby charges the gate of the switch element NTOUT2, and drives the switch element NTOUT2.

The voltage monitor circuit 14-1 monitors the voltage VG1 at the gate of the switch element NTOUT1. Based on the result of monitoring the voltage VG1, the voltage monitor circuit 14-1 performs control together with the control circuit 10 upon the drive circuit 13-1. The voltage monitor circuit 14-2 monitors the voltage VG2 at the gate of the switch element NTOUT2. Based on the result of monitoring the voltage VG2, the voltage monitor circuit 14-2 performs control together with the control circuit 10 upon the drive circuit 13-2. Hereinafter, the voltages VG1 and VG2 may be referred to as voltages VG if they do not need to be differentiated from each other.

1.1.2 Configurations of Drive Circuit and Voltage Monitor Circuit

The configurations of the drive circuit 13 and voltage monitor circuit 14 in the semiconductor device 1 according to the present embodiment will be explained with reference to FIG. 2, which is a circuit diagram for explaining an exemplary configuration of the drive circuit 13 and the voltage monitor circuit 14 in the semiconductor device 1 according to the present embodiment. In FIG. 2, the configurations of the drive circuit 13-1 and voltage monitor circuit 14-1 are illustrated together with the control circuit 10, oscillator 11, and boost circuit 12. In the description below, the configurations of the drive circuit 13-1 and voltage monitor circuit 14-1 will be discussed together with the control circuit 10, oscillator 11, and boost circuit 12. For the drive circuit 13-2 and voltage monitor circuit 14-2, portions similar to those of the drive circuit 13-1 and voltage monitor circuit 14-1 will be omitted, and the description will focus on differences with respect to the drive circuit 13-1 and voltage monitor circuit 14-1.

The control circuit 10 generates a signal S1 in response to a command CMD, and outputs the signal S1 to the oscillator 11 and drive circuit 13. When receiving a command for driving the switch 2, the control circuit 10 switches the signal S1 from the "L" level to the "H" level. When receiving a command for interrupting the drive of the switch 2, the control circuit 10 switches the signal S1 from the "H" level to the "L" level.

The oscillator 11 continues to generate a clock signal and output the signal to the boost circuit 12 during a period of the signal S1 of the control circuit 10 being at the "H" level.

In accordance with the clock signal of the oscillator 11, the boost circuit 12 executes a boosting operation and outputs a voltage VCP during the period of the signal S1 of the control circuit 10 being at the "H" level. The boost circuit 12 stops the boosting operation during the period of the signal S1 being at the "L" level, thereby interrupting the output of the voltage VCP.

The configuration of the drive circuit 13-1 will be explained.

The drive circuit 13-1 includes a pulse generation circuit 130, an OR circuit 131, an AND circuit 132, and an output circuit 133.

The pulse generation circuit 130 includes an input end and an output end. A signal S1 is input to the input end of the pulse generation circuit 130. Based on the signal S1, the pulse generation circuit 130 generates a signal S2. In particular, when the signal S1 changes from the "L" level to the "H" level, the pulse generation circuit 130 turns the signal S2 from the "L" level to the "H" level, and after a first period of time elapses, the pulse generation circuit 130 turns the signal S2 from the "H" level to the "L" level. The first period of time may be set to be longer than the period between the boost circuit 12 starting the boosting and the gate of the switch element NTOUT being fully charged. Each of the drive circuits 13-1 and 13-2 presets the first period of time, for example based on the configuration of the voltage monitor circuit 14. The signal S2 is output from the output end of the pulse generation circuit 130.

The OR circuit 131 includes a first input end, a second input end, and an output end. The first input end of the OR circuit 131 is coupled to the output end of the pulse generation circuit 130, and a signal S2 is input to this first input end. The second input end of the OR circuit 131 is coupled to the voltage monitor circuit 14-1, and a signal S3 of the voltage monitor circuit 14-1 is input to the second input end, as described later. The OR circuit 131 performs an OR operation upon the signal S2 input to the first input end of the OR circuit 131 and the signal S3 input to the second input end of the OR circuit 131 to generate a signal S4. In particular, the OR circuit 131 sets the signal S4 to the "L"

level when the signals S2 and S3 are both at the "L" level, and to the "H" level when at least one of the signals S2 and S3 is at the "H" level. The signal S4 is output from the output end of the OR circuit 131.

The AND circuit 132 includes a first input end, a second input end, and an output end. The signal S1 is input to the first input end of the AND circuit 132. The second input end of the AND circuit 132 is coupled to the output end of the OR circuit 131, and the signal S4 is input to this second input end. The AND circuit 132 performs an AND operation upon the signal S1 input to the first input end of the AND circuit 132 and the signal S4 input to the second input end of the AND circuit 132 to generate a signal S5. In particular, the AND circuit 132 sets the signal S5 to the "H" level when the signals S1 and S4 are both at the "H" level, and to the "L" level when at least one of the signals S1 and S4 is at the "L" level. The signal S5 is output from the output end of the AND circuit 132.

The output circuit 133 includes a first input end, a second input end, and an output end. The first input end of the output circuit 133 is coupled to the output end of the AND circuit 132, and the signal S5 is input to this first input end. The second input end of the output circuit 133 is coupled to the boost circuit 12, and the voltage VCP of the boost circuit 12 is input to the second input end. The output end of the output circuit 133 is coupled to the gate of the switch element NTOUT1 by way of the terminal POUT1. In the drive circuit 13-2, the output end of the output circuit 133 is coupled to the gate of the switch element NTOUT2 by way of the terminal POUT2, although not shown in the drawing. When the signal S5 is at the "H" level, the output circuit 133 transfers the voltage VCP of the boost circuit 12 to the gate of the switch element NTOUT. As a result, the gate of the switch element NTOUT is charged. When the signal S5 is at the "L" level, the output circuit 133 stops the transfer of the voltage VCP. This connects the gate of the switch element NTOUT to a ground. The configuration of the output circuit 133 will be described later in detail.

The configuration of the voltage monitor circuit 14-1 will be explained next.

The voltage monitor circuit 14-1 includes switch elements NT1, NT2, and PT1, and a resistor R1. The switch elements NT1 and NT2 are N-channel MOSFETs. The switch element PT1 is a P-channel MOSFET.

The first end of the switch element NT1 is coupled to a node N1, and the second end of the switch element NT1 is grounded. The gate of the switch element NT1 is coupled to the output end of the output circuit 133.

The first end of the resistor R1 is coupled to node N1. A voltage VBIAS is input to the second end of the resistor R1. The voltage VBIAS is a voltage supplied from the source of voltage (not shown) inside the semiconductor device 1. The voltage VBIAS, however, is not limited to this, and may be a voltage VIN, for example, instead.

The voltage VBIAS is input to the first end of the switch element PT1. The second end of the switch element NT2 is grounded. The gate of the switch element PT1 and the gate of the switch element NT2 are commonly coupled to the node N1. The second end of the switch element PT1 is commonly coupled to the first end of the switch element NT2 and to the second input end of the OR circuit 131. The voltage between the second end of the switch element PT1 and the first end of the switch element NT2 is output as a signal S3 to the second input end of the OR circuit 131.

With the above configuration of the voltage monitor circuit 14, the voltage of the node N1 is at the "L" level, and the signal S3 is at the "H" level, when the voltage VG of the switch element NTOUT is at a threshold voltage or higher of the switch element NT1. When the voltage VG of the switch element NTOUT is lower than the threshold voltage of the switch element NT1, the voltage of the node N1 is at the "H" level, and the signal S3 is at the "L" level.

1.1.3 Configuration of Output Circuit

The configuration of the output circuit 133 in the drive circuit 13 according to the embodiment will be described with reference to FIG. 3, which is a circuit diagram for explaining the exemplary configuration of the output circuit 133 in the drive circuit 13 of the semiconductor device 1 according to the present embodiment. In FIG. 3, the configuration of the output circuit 133 included in the drive circuit 13-1 is illustrated, and in the following description, the output circuit 133 in the drive circuit 13-1 is explained. For the configuration of the output circuit 133 included in the drive circuit 13-2, the portions similar to those of the output circuit 133 included in the drive circuit 13-1 will be omitted from the description, and the description will focus on the portions of the output circuit 133 that differ from those in the drive circuit 13-1.

The output circuit 133 includes a constant current source I1, a current mirror CM1, a current mirror CM2, a transfer control circuit SWTC, and a slew rate control circuit STBC.

The constant current source I1 supplies a current to the current mirror CM1. The current mirror CM1 generates a current based on the current of the constant current source I1 so that the generated current can flow through the current mirror CM2. The current mirror CM2 generates a current based on the current of the current mirror CM1 so that the generated current can flow to the output end of the output circuit 133. The transfer control circuit SWTC controls the current flowing through the current mirror CM1 and the current mirror CM2, and also controls the voltage at the output end of the output circuit 133, based on the signal S5 input to the output circuit 133. The slew rate control circuit STBC supplies a current to the output end of the output circuit 133 so as to stabilize the voltage at the output end of the output circuit 133.

The constant current source I1 is coupled to a node N2. The voltage VBIAS, for example, is input to the constant current source I1. The constant current source I1 outputs a current based on the input voltage VBIAS to the node N2.

The current mirror CM1 includes switch elements NT3 and NT4. The switch elements NT3 and NT4 are N-channel MOSFETs.

The first end of the switch element NT3 is, commonly with the gate of the switch element NT3, coupled to the node N2. The second end of the switch element NT3 is coupled to the transfer control circuit SWTC.

The first end of the switch element NT4 is coupled to a node N3. The second end of the switch element NT4 is coupled to the transfer control circuit SWTC. The gate of the switch element NT4 is coupled to the node N2.

With the above configuration of the current mirror CM1, the current to flow through the switch element NT4 is generated based on the current of the constant current source I1 flowing through the switch element NT3.

The current mirror CM2 includes switch elements PT2 and PT3. The switch elements PT2 and PT3 are P-channel MOSFETs.

The voltage VCP of the boost circuit 12 is input to the first end of the switch element PT2. The second end of the switch element PT2 is, commonly with the gate of the switch element PT2, coupled to a node N3.

A voltage VCP of the boost circuit 12 is input to the first end of the switch element PT3. The second end of the switch element PT3 is coupled to the gate of the switch element NTOUT1 by way of the terminal POUT1. In the drive circuit 13-2, the second end of the switch element PT3 is coupled to the gate of the switch element NTOUT2 by way of the terminal POUT2, although it is not shown in the drawing. The gate of the switch element PT3 is coupled to the node N3.

With the above configuration of the current mirror CM2, a current to flow through switch element PT3 is generated based on the current flowing through the switch element PT2. The gate of the switch element NTOUT is charged by the current to the switch element PT3. This current to the switch element PT3 is based on the voltage VCP of the boost circuit 12. This means that the voltage VCP of the boost circuit 12 is transferred to the gate of the switch element NTOUT.

The transfer control circuit SWTC includes switch elements NT5, NT6, and NT7, a resistor R2, and an inverting circuit INVC1. The switch elements NT5, NT6, and NT7 are N-channel MOSFETs.

The first end of the switch element NT5 is coupled to the second end of the switch element NT3, and the second end of the switch element NT5 is grounded. The signal S5 of the AND circuit 132 is input to the gate of the switch element NT5.

The first end of the switch element NT6 is coupled to the second end of the switch element NT4, and the second end of the switch element NT6 is grounded. The signal S5 of the AND circuit 132 is input to the gate of the switch element NT6.

The inverting circuit INVC1 includes an input end and an output end. The signal S5 of the AND circuit 132 is input to the input end of the inverting circuit INVC1. The inverting circuit INVC1 generates a signal/S5 by inverting the voltage level ("H" level or "L" level) of the signal S5. In particular, the inverting circuit INVC1 sets the signal/S5 to the "L" level when the signal S5 is at the "H" level, and sets the signal/S5 to the "H" level when the signal S5 is at the "L" level. The signal/S5 is output from the output end of the inverting circuit INVC1.

The first end of the switch element NT7 is coupled to the second end of the switch element PT3 (i.e., to the output end of the output circuit 133) by way of the resistor R2. The second end of the switch element NT7 is grounded. The gate of the switch element NT7 is coupled to the output end of the inverting circuit INVC1, and the signal/S5 is input to this gate.

With the transfer control circuit SWTC having the above configuration, when the signal S5 is at the "H" level, the switch elements NT5 and NT6 enter the ON state, while the switch element NT7 enters the OFF state. As a result, a current flows through the current mirror CM1 and current mirror CM2, and the voltage VCP of the boost circuit 12 is transferred to the gate of the switch element NTOUT via the terminal POUT. When the signal S5 is at the "L" level, the switch elements NT5 and NT6 enter the OFF state, while the switch element NT7 enters the ON state. As a result, the gate of the switch element NTOUT is grounded via the switch element NT7, and the voltage VG at the gate of the switch element NTOUT becomes a ground voltage VSS.

The slew rate control circuit STBC includes switch elements NT8 and PT4, a resistor R3, and a delay circuit DLYC. The switch element NT8 is an N-channel MOSFET. The switch element PT4 is a P-channel MOSFET.

The voltage VCP of the boost circuit 12 is input to the first end of the resistor R3. The second end of the resistor R3 is coupled to a node N4.

The voltage VCP of the boost circuit 12 is also input to the first end of the switch element PT4. The second end of the switch element PT4 is coupled to the second end of the switch element PT3 and to the first end of the resistor R2. The gate of the switch element PT4 is coupled to the node N4. The resistance value of the ON-state switch element PT4 is smaller, for example, than that of the ON-state switch element PT3. Hereinafter, the resistance of the ON-state switch element will be referred to as an ON resistance. By setting the ON resistance of the switch element PT3 larger than that of the switch element PT4, a large current flow to the switch element PT3 of the current mirror CM2 can be suppressed. The values of the ON resistances of the switch elements PT3 and PT4 can be suitably changed in accordance, for example, with the voltage withstanding characteristics and ON resistance of the switch element NTOUT.

The delay circuit DLYC has an input end and output end. The signal S5 of the AND circuit 132 is input to the input end of the delay circuit DLYC. Based on the signal S5, the delay circuit DLYC generates a signal S6. In particular, when the signal S5 changes from the "L" level to the "H" level, the delay circuit DLYC changes the signal S6 from the "L" level to the "H" level after the conclusion of the first period of time elapsed. That is, the delay circuit DLYC delays the change of the signal S6 from the "L" level to the "H" level (hereinafter this may be referred to as a "rising edge") for the first period of time with reference to the rising edge of the signal S5. When the signal S5 is at the "H" level and the first period of time has not yet elapsed, or when the signal S5 is at the "L" level, the delay circuit DLYC sets the signal S6 to the "L" level. The output end of the delay circuit DLYC outputs the signal S6.

The delay circuit DLYC may delay the rising edge of the signal S6 for a second period of time which differs from the first period of time. The second period of time may represent a period of time between the time of the signal S5 changing from the "L" level to the "H" level and the time of the voltage at the gate of the switch element NTOUT becoming a predetermined voltage through the drive operation of the semiconductor device 1, which will be described later. This predetermined voltage is higher than the ground voltage VSS, and lower than the voltage VCP. The delay circuit DLYC may predetermine the voltage based on the ON resistance of the switch element PT3, voltage VCP, and the like. The delay circuit DLYC may be configured to include a structure for monitoring the voltage, for example at the gate of the switch element NTOUT. In such an event, the second period of time may be a period during which the voltage at the gate of the switch element NTOUT monitored by the delay circuit DLYC is equal to or higher than the predetermined voltage.

The first end of the switch element NT8 is coupled to the node N4. The second end of the switch element NT8 is grounded. The gate of the switch element NT8 is coupled to the output end of the delay circuit DLYC, and a signal S6 is input to this gate.

With the slew rate control circuit STBC having the above configuration, when the gate of the switch element NTOUT is charged until the voltage at the gate reaches a predetermined voltage, the switch elements NT8 and PT4 enter the ON state, and a current flows through the switch element PT4. The current flowing through the switch element PT4 thereby charges, together with the current flowing through the switch element PT3, the gate of the switch element NTOUT so that the voltage VCP at the boost circuit 12 can be transferred to the gate of the switch element NTOUT. As mentioned earlier, the ON resistance of the switch element PT4 is smaller than that of the switch element PT3. This means that the current flowing through the switch element PT4 is larger than that of the switch element PT3. As a result, the current flowing through the switch element PT4 may suppress fluctuations of the voltages VG1 and VG2 at the gate of the switch element NTOUT, which may be caused by noise.

1.2 Operations

Figure 4:
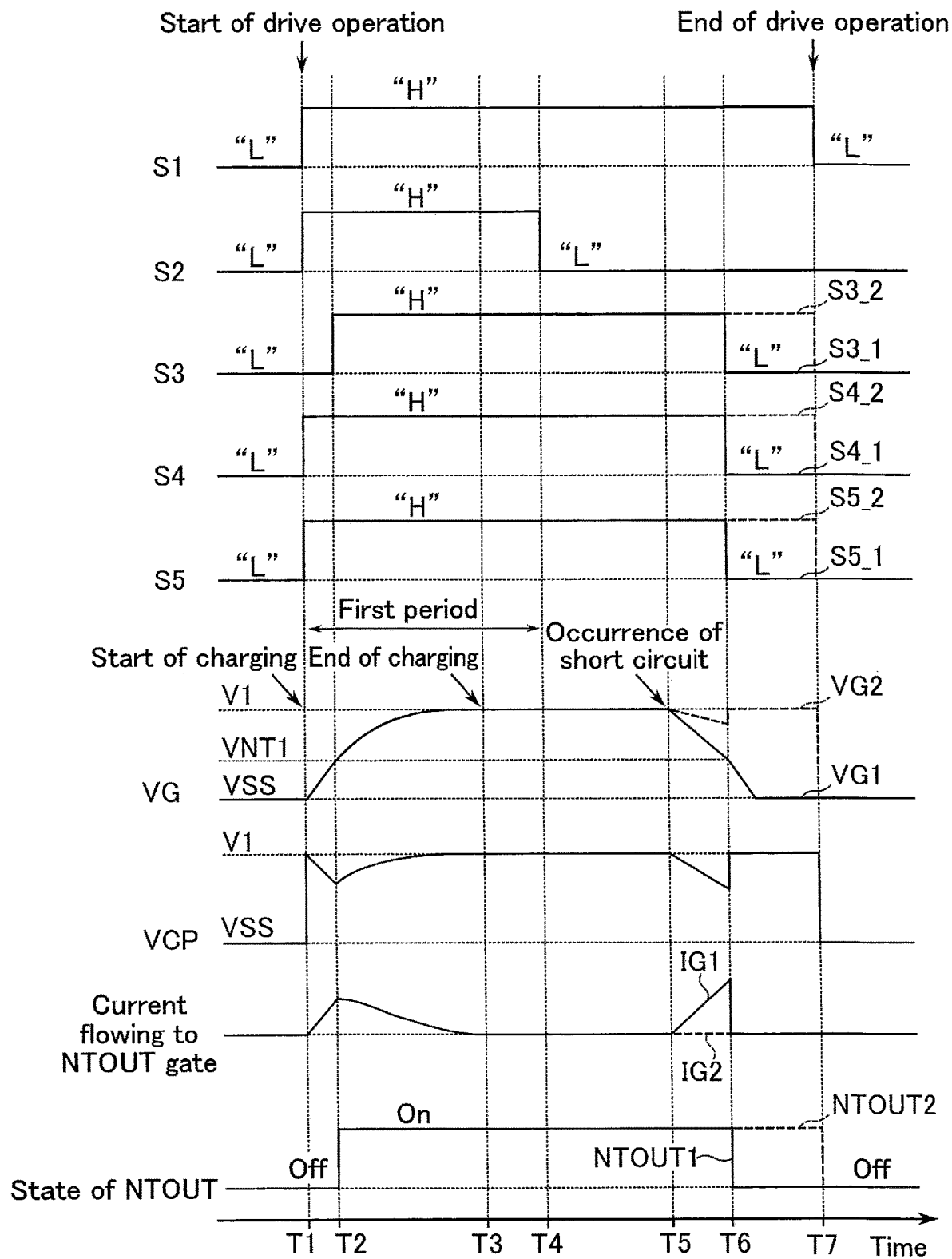
FIG. 4 is a timing chart showing an exemplary drive operation of the semiconductor device according to the present embodiment when driving an external switch using the semiconductor device.

The operation of the semiconductor device 1 according to the present embodiment will be explained with reference to FIG. 4, which is a timing chart of the drive operation performed by the semiconductor device 1 according to the present embodiment. The drive operation refers to an operation performed by the semiconductor device 1 starting at the time of the control circuit 10 receiving a command for driving the switch 2 until the time of the control circuit 10 receiving a command for interrupting the operation of the switch 2. In FIG. 4, short-circuiting caused at the gate of the switch element NTOUT1 during the drive operation is illustrated.

In the following description, when the signals S3, S4 and S5 of the drive circuit 13-1 need to be distinguished from the signals S3, S4 and S5 of the drive circuit 13-2, they will be referred to as signals S3_1, S4_1 and S5_1, and signals S3_2, S4_2 and S5_2, respectively.

The threshold voltage VNT1 of the switch element NT1 being approximately the same as the threshold voltage of each of the switch elements NTOUT1 and NTOUT2 is described below as an example. The threshold voltage VNT1 is higher than the ground voltage VSS. This is not a limitation, however. The threshold voltage VNT1 may be higher than the threshold voltage of the switch element NTOUT, or lower than the threshold voltage of the switch element NTOUT.

In the following description, the boost circuit 12 is configured to boost the voltage VIN to a voltage V1 and output the boosted voltage. The voltage V1 is approximately the same as the maximum value of the voltage VCP of the boost circuit 12, and is higher than the threshold voltage VNT1 of the switch element NT1.

At time T1, the control circuit 10 receives a command for driving the switch 2. In response, the semiconductor device 1 initiates the drive operation ("Start of drive operation" in FIG. 4). Based on the received command, the control circuit 10 changes the signal S1 from the "L" level to the "H" level. In accordance with the change of the signal S1, the pulse generation circuit 130 of the drive circuit 13 changes the signal S2 from the "L" level to the "H" level.

At time T1, the voltage VG1 is lower than the threshold voltage VNT1, and therefore the voltage monitor circuit 14 sets the signal S3 to the "L" level, based on the voltage VG1 monitored by the voltage monitor circuit 14. Based on the "H"-level signal S2 and "L"-level signal S3, the OR circuit 131 outputs the "H"-level signal S4. Based on the "H"-level signal S1 and "H"-level signal S4, the AND circuit 132 outputs the "H"-level signal S5.

The oscillator 11 generates a clock signal based on the "H"-level signal S1. Based on the generated clock signal, the boost circuit 12 boosts the voltage VIN to the voltage V1, and the boosted voltage V1 is transferred to the second input end of the output circuit 133 of the drive circuit 13. Based on the "H"-level signal S5, the output circuit 133 of the drive circuit 13 starts charging the gates of the switch elements NTOUT ("Start of charging" in FIG. 4). The voltage VCP of the boost circuit 12 is lower than the voltage V1 until the charging of the gates of the switch elements NTOUT is completed. A current IG1 flows through the output end of the output circuit 133 of the drive circuit 13-1 to charge the gate of the switch element NTOUT1, while a current IG2 flows through the output end of the output circuit 133 of the drive circuit 13-2 to charge the gate of the switch element NTOUT2.

At time T2, the gate of the switch element NTOUT is charged until it reaches the threshold voltage VNT1. Thus, based on the voltage VG, the voltage monitor circuit 14 changes the signal S3 from the "L" level to the "H" level.

The switch elements NTOUT1 and NTOUT2 are switched from the OFF state to the ON state.

At time T3, the voltages VG1, VG2, and VCP all reach the voltage V1, and the charging of the gates of the switch element NTOUT1 and switch element NTOUT2 is completed ("End of charging" in FIG. 4). The currents IG1 and IG2 are therefore basically interrupted.

At time T4, the pulse generation circuit 130 of the drive circuit 13 changes the signal S2 from the "H" level to the "L" level after the first period of time elapses from time T1.

At time T5, a short circuit occurs at the gate of the switch element NTOUT1. Due to the short circuit, the current IG1 flows through the output end of the output circuit 133 of the drive circuit 13-1, lowering the voltage VG1. In accordance with the decrease in the voltage VG1, the voltage VCP of the boost circuit 12 and the voltage VG2 are also lowered. The per-time decrease ratio of the voltage VG2 is lower than the per-time decrease ratio of the voltage VG1.

At time T6, due to the short circuit at the gate of the switch element NTOUT1, the voltage VG1 at the gate of the switch element NTOUT1 becomes lower than the threshold voltage VNT1 of the switch element NT1. Based on the voltage VG1, the voltage monitor circuit 14-1 changes the signal S3_1 from the "H" level to the "L" level. Based on the "L"-level signal S3_1 and "L"-level signal S2, the OR circuit 131 outputs the signal S4_1 at the "L"-level. Based on the "H"-level signal S1 and "L"-level signal S4_1, the AND circuit 132 outputs the signal S5_1 at the "L"-level. In response, the output circuit 133 of the drive circuit 13-1 sets the voltage VG1 at the gate of the switch element NTOUT1 to the ground voltage VSS. This stops the supply of the current IG1, as a result of which the voltage VCP of the boost circuit 12 and voltage VG2 at the gate of the switch element NTOUT2 return to the voltage V1.

The switch element NTOUT1 is switched from the ON state to the OFF state, while the switch element NTOUT2 maintains the ON state.

At time T7, the control circuit 10 receives a command for stopping driving the switch 2, and based on the received command, the signal S1 changes from the "H" level to the "L" level. In response, the signals S3_2, S4_2 and S5_2 change from the "H" level to the "L" level, and the boosting of the voltage VIN by the boost circuit 12 is interrupted. The voltages VG2 and VCP fall to the ground voltage VSS, and the switch element NTOUT2 enters, together with the switch element NTOUT1, the OFF state. In this manner, the drive operation of the semiconductor device 1 is completed ("End of drive operation" in FIG. 4).

1.3 Effects of Present Embodiment

According to the present embodiment, an increase in the current due to a short circuit can be suppressed. The effects of the embodiment will be described below.

When an external switch element that is an N-channel MOSFET is used on the low side, the first end of the external switch element is coupled to a load such as an LED and solenoid driven by an external power supply or the like. The second end of the external switch element may be grounded. The gate of the external switch element is coupled to a semiconductor device for driving the external switch element. The semiconductor device inputs a voltage to the gate of the external switch element to drive the external switch element so that the current sent to the load flows from the first end to the second end of the external switch element. When driving the external switch element, the semiconductor device outputs a voltage higher than or equal to 10 V and lower than 20 V to the gate of the external switch element.

On the other hand, when the external switch element that is an N-channel MOSFET is used on the high side, the first end of the external switch element is coupled to an external power supply such as a portable electronic apparatus by way of a USB terminal or the like. The second end of the external switch element is coupled to a power supply IC, battery or the like which differs from the external power supply coupled to the first end of the external switch element. The gate of the external switch element is coupled to the semiconductor device for driving the external switch element. The external power supply may drive with 40 V to 50 V, and a voltage of, for example, 40 V may be input to the first end of the external switch element. In general, the ON resistance of the external switch element takes a value of 10 mΩ. When, for example, the load current flowing from the external power supply to the first end of the external switch element is 10 A, the potential difference between the first end and the second end of the external switch element is as low as 100 mV, which is sufficiently lower than the voltage input to the first end of the external switch element. Thus, the voltage at the second end of the external switch element is approximately the same as the voltage at the first end of the external switch element (e.g., (40-0.1) V). When driving the external switch element, the semiconductor device inputs to the gate of the external switch element a voltage (e.g., voltage higher than or equal to (40+Vth) V) higher than or equal to the total voltage of the voltage at the second end of the external switch element and the threshold voltage Vth of the external switch element. That is, for the use of the external switch element on the high side, the voltage input to the gate of the external switch element is considerably higher than the voltage input to the gate of the external switch element for the use of the external switch element on the low side. Thus, in the use of the external switch element on the high side, the current that flows from the semiconductor device to the gate of the external switch element due to the occurrence of, for example, a short circuit at the gate of the external switch element, is considerably larger than the current flowing from the semiconductor device to the gate of the external switch element in the use of the external switch element on the low side due to the occurrence of a short circuit at the gate of the external switch element. For this reason, if the external switch element is used on the high side, it is preferable that the current flowing from the semiconductor device to the gate of the external switch element due to a short circuit or the like at the gate of the external switch element be prevented from increasing.

According to the present embodiment, the boost circuit 12 boosts the voltage VIN to the voltage VCP, and outputs the boosted voltage to the drive circuit 13-1. The drive circuit 13-1 transfers the voltage VCP to the gate of the external switch element NTOUT1 via the terminal POUT1. In this manner, the drive circuit 13-1 charges the gate of the switch element NTOUT1, and drives the switch element NTOUT1. The voltage monitor circuit 14-1 monitors the voltage VG1 at the gate of the switch element NTOUT1 charged by the drive circuit 13-1. The voltage monitor circuit 14-1 generates a signal S3, which is at the "H" level when, in the voltage monitor circuit 14-1, the voltage VG1 is higher than or equal to the threshold voltage VNT1 of the switch element NTOUT1 and is at the "L" level when the voltage VG1 is lower than the threshold voltage VNT1. The drive circuit 13-1 is configured to interrupt the transfer of the voltage VCP to the gate of the switch element NTOUT1 based on the "L"-level signal S3. Thus, when the voltage VG1 at the gate of the switch element NTOUT1 becomes lower than the threshold voltage VNT1 of the switch element NTOUT1 due to a short circuit at the gate of the switch element NTOUT1, the semiconductor device 1 can interrupt the transfer of the voltage VCP to the short-circuited gate of the switch element NTOUT1, based on the "L"-level signal S3. In this manner, an increase in the current sent to the short-circuited gate of the switch element NTOUT1 can be suppressed. For this reason, even when the external switch element is used on the high side, an increase in the current due to a short-circuited gate of the switch element NTOUT can be suppressed. The same effect can be produced by the semiconductor device 1 according to the present embodiment having a single drive circuit 13 and a single voltage monitor circuit 14.

According to the present embodiment, the boost circuit 12 outputs a voltage VCP to the drive circuit 13-2 in addition to the drive circuit 13-1. The drive circuit 13-2 transfers the voltage VCP to the gate of the external switch element NTOUT2 via the terminal POUT2. The drive circuit 13-2 thereby charges the gate of the switch element NTOUT2, and drives the switch element NTOUT2. That is, the semiconductor device 1 drives the two switch elements NTOUT1 and NTOUT2 of the external switch 2 in parallel. In this manner, if a short circuit occurs at the gate of the switch element NTOUT1, the transfer of the voltage VCP to the gate of the switch element NTOUT1 is interrupted so that a considerable decrease in the voltage VCP of the boost circuit 12 can be suppressed, and a considerable decrease in the voltage VG2 at the gate of the switch element NTOUT2, which is not short-circuited, can also be suppressed. The semiconductor device 1 can thereby maintain the driving of the switch element NTOUT2, while stopping the driving of the switch element NTOUT1. Thus, even if a short circuit occurs at a switch element NTOUT in the switch 2, another switch element NTOUT in the switch 2 that is not short-circuited is prevented from entering the OFF state.

2. MODIFICATION EXAMPLES

The above embodiment may be modified in various manners.

Semiconductor devices according to various modification examples will be described below. The configuration and operation of the semiconductor device 1 according to the modification examples will be explained below, focusing on portions that differ from those of the semiconductor device according to the embodiment. The semiconductor device according to the modification examples can produce effects similar to those of the embodiment.

2.1 Modification Example 1

In the example of the embodiment, the voltage VG at the gate of the switch element NTOUT is input directly to the gate of the switch element NT1 in the voltage monitor circuit 14, but this is not a limitation. For instance, the voltage VG at the gate of the switch element NTOUT may be lowered and input to the gate of the switch element NT1 in the voltage monitor circuit 14.

A semiconductor device 1 according to the first modification example will be explained with reference to FIG. 5, which is a circuit diagram for explaining an exemplary configuration of the voltage monitor circuit 14-1 in the semiconductor device 1 according to the first modification example. The configuration of the voltage monitor circuit 14-1 is illustrated in FIG. 5 and mainly explained below, as an example. For the configuration of the voltage monitor circuit 14-2, its portions similar to those of the voltage monitor circuit 14-1 will be omitted from the explanation, and portions that differ from those of the voltage monitor circuit 14-1 will be mainly explained.

The semiconductor device 1 according to the first modification example, excluding the voltage monitor circuit 14, has a configuration similar to that of embodiment, and therefore the explanation will be omitted.

The voltage monitor circuit 14 according to the first modification example includes a level shift circuit 140.

The level shift circuit 140 is a circuit configured to lower the voltage VG at the gate of the switch element NTOUT.

The level shift circuit 140 includes a switch element NT9 and a resistor R4. The switch element NT9 is a high-voltage withstanding N-channel MOSFET configured to set a potential difference between the first end and second end of the switch element NT9 higher than or equal to the voltage V1 of the boost circuit 12.

The first end of the switch element NT9 is coupled to the output end of the output circuit 133 in the drive circuit 13-1. In the voltage monitor circuit 14-2, which is not illustrated in FIG. 5, the first end of the switch element NT9 is coupled to the output end of the output circuit 133 in the drive circuit 13-2. The second end of the switch element NT9 is coupled to the gate of the switch element NT1. A reference voltage VREF1 is input to the gate of the switch element NT9. The reference voltage VREF1 represents a voltage determined in a manner such that a difference voltage (VREF1−VNT9) between the reference voltage VREF1 and the threshold voltage VNT9 of the switch element NT9 is higher than or equal to the threshold voltage VNT1 of the switch element NT1 and lower than the voltage V1 of the boost circuit 12. The reference voltage VREF1 may be supplied from the source of voltage inside the semiconductor device 1, which differs from the source of the voltage VBIAS. This is not a limitation, however. The reference voltage VREF1 may be supplied from the same source of voltage inside the semiconductor device 1 as the source of the voltage VBIAS, or may be a voltage VIN supplied from the outside of the semiconductor device 1.

The first end of the resistor R4 is coupled to the gate of the switch element NT1 and the second end of the switch element NT9. The second end of the resistor R4 is grounded.

The configuration of the voltage monitor circuit 14 according to the first modification example, excluding the level shift circuit 140, is the same as that of the voltage monitor circuit 14 according to the embodiment.

The operation of the semiconductor device 1 according to the first modification example will be explained. The operation according to the first modification example is basically the same as that of the embodiment, except for the voltage to be input to the gate of the switch element NT1. The voltage input to the gate of the switch element NT1 will be mainly explained below, and other portions will be omitted from the explanation.

At time T2, when the switch element NT9 enters the ON state, the voltage at the second end of the switch element NT9 is input to the gate of the switch element NT1. The voltage at the second end of the switch element NT9 is the aforementioned difference voltage (VREF1−VNT9). This causes the switch element NT1 to enter the ON state, which changes the signal S3 from the "L" level to the "H" level.

At time T6, the voltage VG1 at the gate of the switch element NTOUT1 decreases, causing the switch element NT9 to enter the OFF state. As a result, the switch element NT1 enters the OFF state, changing the signal S3 from the "H" level to the "L" level.

According to the first modification example, a voltage lower than or equal to the difference voltage (VREF1−VNT9) is input to the gate of the switch element NT1. As a result, even if the voltage VG of the charged gate of the switch element NTOUT is higher than the maximum voltage that can be input to the gate of the switch element NT, the switch element NT1 can be prevented from being degraded or broken by the voltage VG directly input to the gate of the switch element NT1.

2.2 Modification Example 2

In the example of the embodiment, when a short circuit occurs at the gate of a switch element NTOUT, the transfer of the voltage to the short-circuited gate of the switch element NTOUT is interrupted. This is not a limitation, however. For instance, if the voltage monitor circuit 14 interrupts the transfer of the voltage to the short-circuited gate of the switch element NTOUT and thereafter the short circuit is corrected at the gate of the switch element NTOUT, the transfer of the voltage VCP to the gate of the switch element may be resumed by an automatic recovery circuit.

The configuration of a semiconductor device 1 according to the second modification example will be explained with reference to FIG. 6, which is a circuit diagram explaining an exemplary configuration of the voltage monitor circuit 14-1 in the semiconductor device 1 according to the second modification example. The configuration of the voltage monitor circuit 14-1 will be mainly explained below. For the configuration of the voltage monitor circuit 14-2, portions similar to those of the voltage monitor circuit 14-1 will be omitted from the explanation, and portions that differ from those of the voltage monitor circuit 14-1 will be focused on. The configuration of the semiconductor device 1 according to the second modification example, excluding the voltage monitor circuit 14, is the same as that of the embodiment, and thus will be omitted from the explanation.

The voltage monitor circuit 14 according to the second modification example includes an automatic recovery circuit 141.

The automatic recovery circuit 141 is configured to, when the short circuit is corrected, automatically change the voltage at the gate of the switch element NTOUT, which is set to the ground voltage VSS, to a voltage higher than or equal to the threshold voltage of the switch element NT1.

The automatic recovery circuit 141 includes a switch element NT10, a diode D, and a resistor R5. The switch element NT10 is an N-channel MOSFET.

The voltage VBIAS is input to the first end of the switch element NT10. The signal S1 of the control circuit 10 is input to the gate of the switch element NT10. The second end of the switch element NT10 is coupled to the gate of the switch element NT1 and to the output end of the output circuit 133 of the drive circuit 13-1 by way of the serially coupled diode D and resistor R5. The diode D establishes a forward connection between the switch element NT10 and resistor R5. That is, the anode of the diode D is coupled to the second end of the switch element NT10, and the cathode of the diode D is coupled to the first end of the resistor R5. The second end of the resistor R5 is coupled to the gate of the switch element NT1 and the output end of the output circuit 133 of the drive circuit 13-1. The value of the ON resistance of the switch element NT10 is sufficiently negligible with respect to the resistance value Rv2 of the resistor R2 in the output circuit 133 and the resistance value Rv5 of the resistor R5. Furthermore, according to the second modification example, the voltage VBIAS, forward voltage Vf of the diode D, and resistors R2 and R5 are determined so that the voltage VRT1 described later will satisfy the first condition described later.

In the voltage monitor circuit 14-2, which is not illustrated, the second end of the resistor R5 is coupled to the gate of the switch element NT1 and to the output end of the output circuit 133 of the drive circuit 13-2.

The configuration of the voltage monitor circuit 14 according to the second modification example, excluding the automatic recovery circuit 141, is the same as that of the voltage monitor circuit 14 according to the embodiment.

The operation of the semiconductor device 1 according to the second modification example will be explained with reference to FIG. 7, which is a timing chart of the drive operation of the semiconductor device 1 according to the second modification example.

The operation performed after the voltage VG1 is lowered to the ground voltage VSS during a period between time T6 and time T7 in the embodiment will be explained below. The operation before the voltage VG1 is lowered to the ground voltage VSS is basically the same as that of the embodiment, and therefore is omitted from the explanation.

Figure 7:
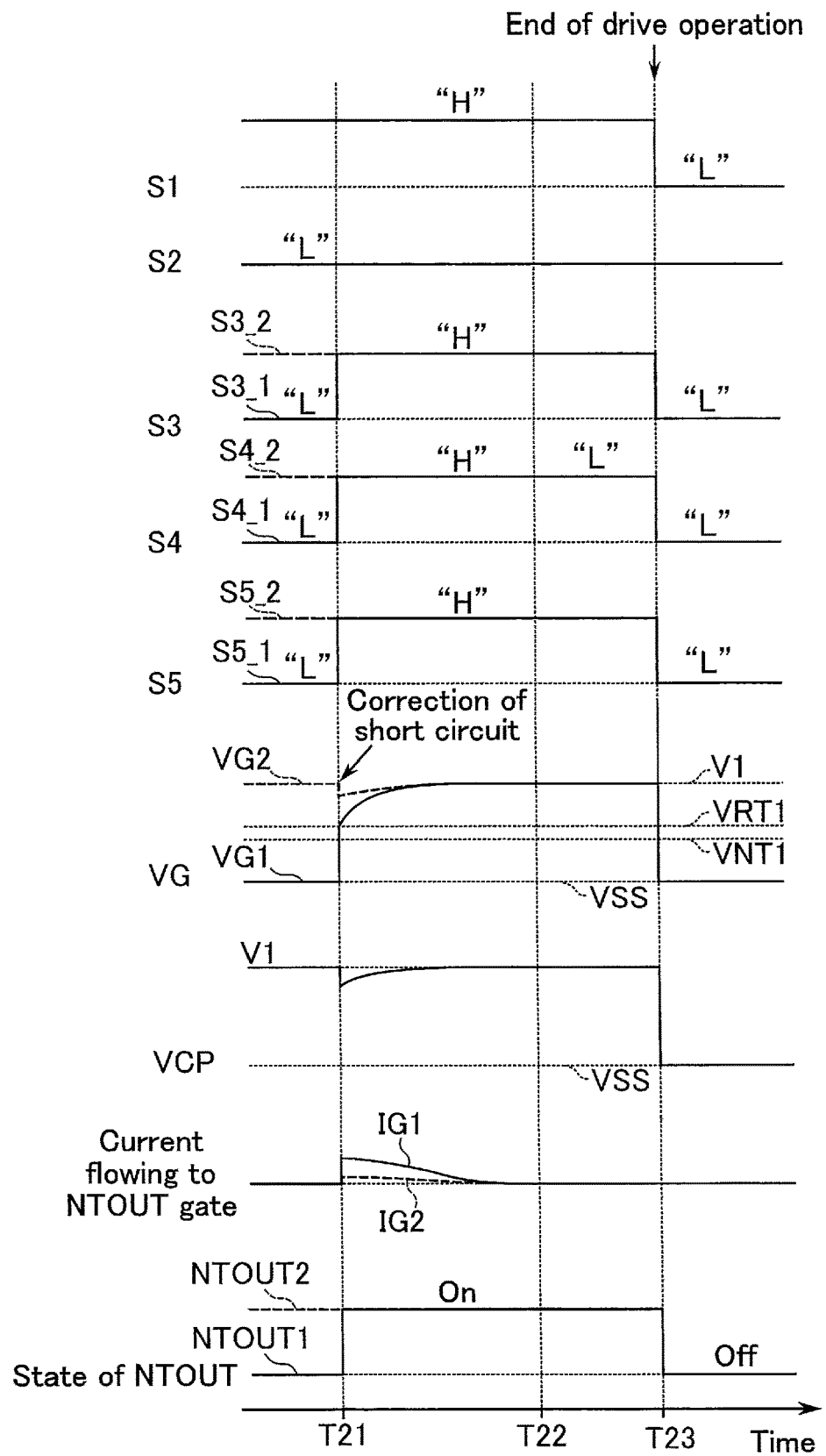
FIG. 7 is a timing chart showing an exemplary drive operation of the semiconductor device according to the second modification example when driving an external switch using the semiconductor device.

At time T21, the short circuit is corrected at the gate of the switch element NTOUT1 ("Correction of short circuit" in FIG. 7). Here, the gate of the switch element NTOUT1 is grounded by way of the resistor R2 of the transfer control circuit SWTC included in the output circuit 133 of the drive circuit 13-1, and the voltage VBIAS is supplied by way of the diode D and resistor R5 of the automatic recovery circuit 141. The voltage VG1 at the gate of the switch element NTOUT1 reaches the voltage VRT1 as expressed below by Equation (1). The voltage VRT1 is higher than or equal to the threshold voltage VNT1 of the switch element NT1 (first condition). This causes the switch element NTOUT1 to enter the ON state.

$$VRT1=Rv2\times(VBIAS-Vf)/(Rv2+Rv5)) \quad (1)$$

Further, based on the voltage VRT1 input to the gate of the switch element NT1, the voltage monitor circuit 14-1 changes the signal S3_1 from the "L" level to the "H" level. Based on the "L"-level signal S2 and "H"-level signal S3_1, the OR circuit 131 changes the signal S4_1 from the "L" level to the "H" level. Based on the "H"-level signal S1 and "H"-level signal S4_1, the AND circuit 132 changes the signal S5_1 from the "L" level to the "H" level.

Moreover, based on the "H"-level signal S5, the output circuit 133 of the drive circuit 13-1 starts charging the gate of the switch element NTOUT1. With the gate of the switch element NTOUT1 being charged, the voltages VCP and VG2 of the boost circuit 12 become lower than the voltage V1. This causes the gate of the switch element NTOUT2 to also be charged. The voltage VG2, however, is maintained higher than the threshold voltage VNT1 of the switch element NTOUT. In other words, the switch element NTOUT2 is maintained in the ON state. When the gates of the switch elements NTOUT1 and NTOUT2 are being charged, the currents IG1 and IG2 flow to the gates of the switch elements NTOUT1 and NTOUT2, respectively. The current IG1 is larger than the current IG2.

At time T22, charging of the gates of the switch element NTOUT1 and switch element NTOUT2 is completed, and the voltages VG1, VG2 and VCP reach the voltage V1.

At time T23, through the same operation as the operation of the embodiment at time T7, the signals S1, S3, S4, and S5 are changed from the "H" level to the "L" level, and the boosting of the voltage VIN by the boost circuit 12 is interrupted. Furthermore, the voltages VG1, VG2 and VCP drop to the ground voltage VSS, causing the switch element NTOUT to enter the OFF state. The drive operation of the semiconductor device 1 is completed in this manner ("End of drive operation" in FIG. 7).

With the above configuration, the semiconductor device 1 does not need to be interrupted and then restarted in order to cause the switch element NTOUT to re-enter the ON state when a short circuit that has occurred at the gate of the switch element NTOUT is corrected by causing the switch element NTOUT to enter the OFF-state. This can avoid an increase in the current in accordance with recharging of the gates of all the switch elements NTOUT.

Figure 6:
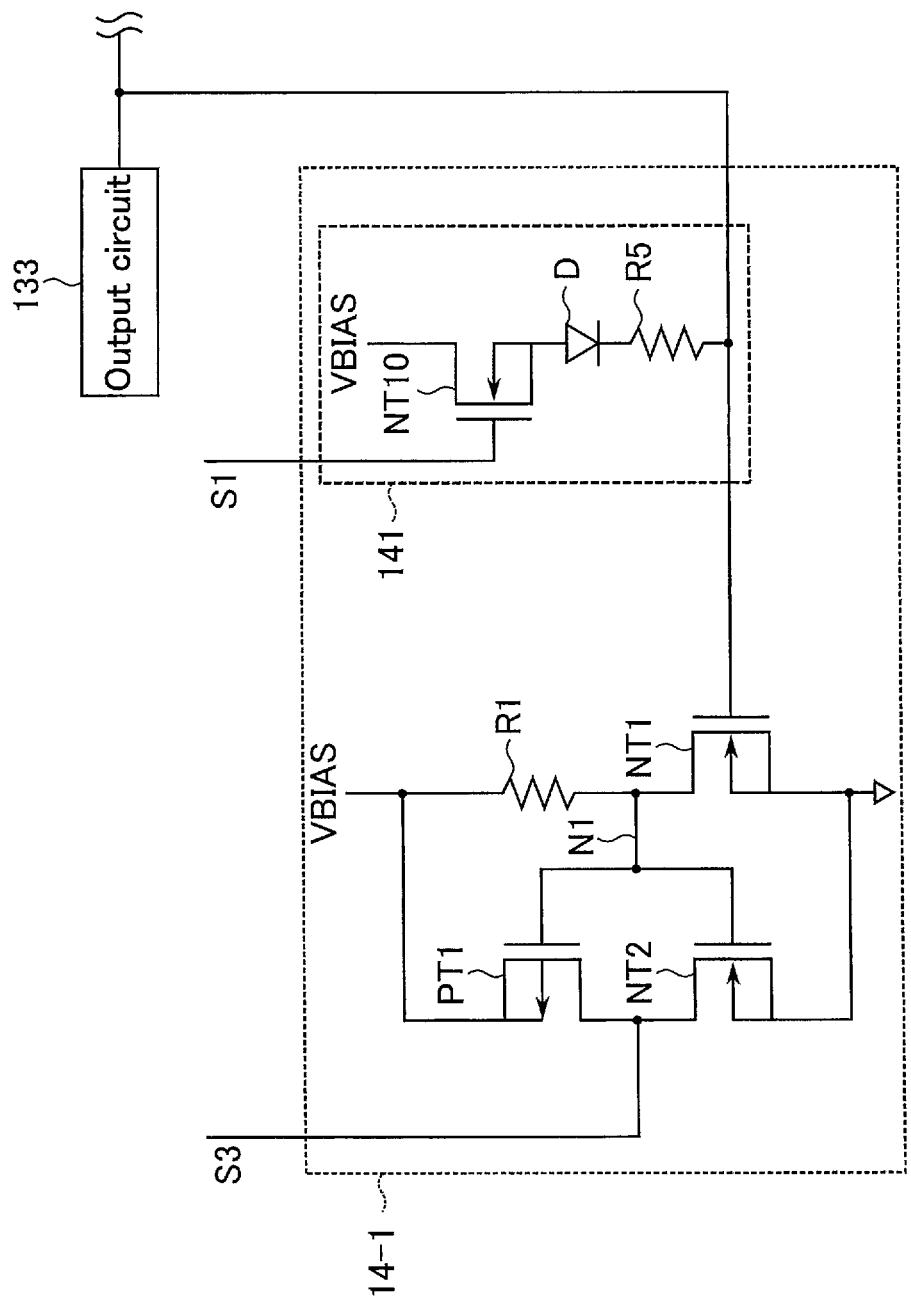
FIG. 6 is a circuit diagram for explaining an exemplary configuration of a voltage monitor circuit of a semiconductor device according to a second modification example.

In the example of FIG. 6, the voltage monitor circuit 14 does not include a level shift circuit 140, but this is not a limitation. The voltage monitor circuit 14 may include a level shift circuit 140. In such a configuration, the second end of the resistor R5 of the automatic recovery circuit 141 is coupled to the first end of the switch element NT9 and to the output end of the output circuit 133 of the drive circuit 13 in the first modification example. Such a configuration produces effects similar to the first modification example.

2.3 Modification Example 3

In the second modification example, the automatic recovery circuit 141 includes an N-channel MOSFET, which is not a limitation. The automatic recovery circuit 141 may include a P-channel MOSFET and an inverting circuit in place of the N-channel MOSFET.

A semiconductor device 1 according to the third modification example will be explained with reference to FIG. 8, which is a circuit diagram for explaining an exemplary configuration of the voltage monitor circuit 14-1 in the semiconductor device 1 according to the third modification example.

The configuration of the semiconductor device 1 according to the third modification example excluding for the automatic recovery circuit 141 is basically the same as that of the second modification example, and thus is omitted from the explanation. In addition, the operation of the semiconductor device 1 according to the third modification example is basically the same as that of the second modification example, and thus is omitted from the explanation.

The automatic recovery circuit 141 according to the third modification example includes an inverting circuit INVC2, a switch element PT5, a diode D, and a resistor R5. The switch element PT5 is a P-channel MOSFET.

The inverting circuit INVC2 includes an input end and an output end. To the input end of the inverting circuit INVC2 is input the signal S1 of the control circuit 10. The inverting circuit INVC2 generates a signal/S1 by inverting the voltage level ("H" level or "L" level) of the signal S1. In particular, the inverting circuit INVC2 sets the signal/S1 to the "L" level when the signal S1 is at the "H" level, and sets the signal/S1 to the "H" level when the signal S1 is at the "L" level. The signal/S1 is output from the output end of the inverting circuit INVC2.

The voltage VBIAS is input to the first end of the switch element PT5. The gate of the switch element PT5 is coupled to the output end of the inverting circuit INVC2. The second end of the switch element PT5 is coupled to the gate of the switch element NT1 in a similar manner to the second end of the switch element NT10 in the second modification example.

The above configuration produces basically the same effects as in the second modification example.

In the example of FIG. 8, the voltage monitor circuit 14 does not include a level shift circuit 140, but this is not a limitation. The voltage monitor circuit 14 according to the third modification example may include a level shift circuit 140. If this is the case, the second end of the resistor R5 of the automatic recovery circuit 141 is coupled to the first end of the switch element NT9 and to the output end of the output circuit 133 of the drive circuit 13 in the first modification example. Such a configuration produces effects similar to the first modification example.

2.4 Modification Example 4

In the second and third modification examples, when the short circuit is corrected at the gate of the switch element NTOUT, the voltage at the gate of the switch element NTOUT results in the voltage VRT1 expressed by the resistance values Rv2 and Rv5, voltage VBIAS, and forward voltage Vf of the diode D, which is not a limitation. When the short circuit is corrected at the gate of the switch element NTOUT, the voltage at the gate of the switch element NTOUT may result in a voltage expressed by the voltage VBIAS and forward voltage Vf.

Figure 9:
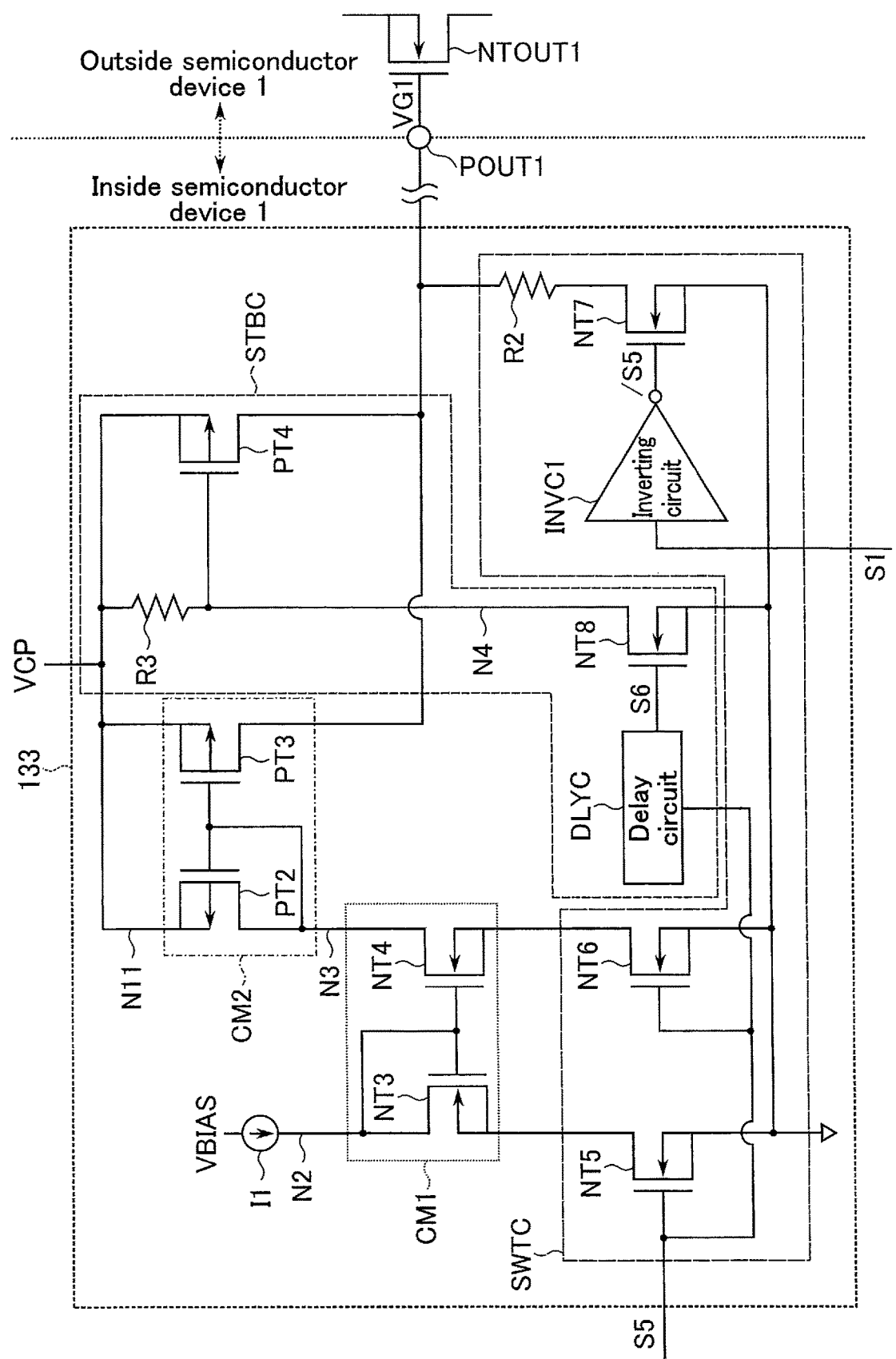
FIG. 9 is a circuit diagram for explaining an exemplary configuration of an output circuit included in a drive circuit of a semiconductor device according to a fourth modification example.

The semiconductor device 1 according to the fourth modification example will be explained with reference to FIG. 9, which is a circuit diagram for explaining an exemplary configuration of the output circuit 133 in the semiconductor device 1 according to the fourth modification example. The configuration of the semiconductor device 1 according to the fourth modification example, excluding the output circuit 133, is basically the same as the configurations of the second and third modification examples, and thus is omitted from the explanation.

According to the fourth modification example, the signal S1 of the control circuit 10 is input to the input end of the inverting circuit INVC1 included in the transfer control circuit SWTC.

The rest of the configuration of the output circuit 133 is basically the same as the configurations of the embodiment and the first to third modification examples.

In the fourth modification example, the voltage VBIAS and the forward voltage Vf of the diode D are determined in a manner such that the voltage VRT2 described later will satisfy the second condition described later.

The operation of the fourth modification example will be explained. The operation of the fourth modification example is basically the same as the operations of the second and third modification examples, except for the value of the voltage VG at time T21 in the second modification example. The following explanation will mainly focus on the voltage VG at time T21, and the rest of the operation is omitted from the explanation.

At time T21, when the short circuit is corrected at the gate of the switch element NTOUT1, a voltage VBIAS is supplied to the gate of the switch element NTOUT1 via the diode D in the automatic recovery circuit 141 of the voltage monitor circuit 14-1. The voltage VG1 at the gate of the switch element NTOUT1 thereby reaches the voltage VRT2 as expressed below by Equation (2). The voltage VRT2 is higher than or equal to the threshold voltage VNT1 of the switch element NT1 (second condition). This causes the switch element NTOUT1 to enter the ON state.

$$VRT2 = VBIAS - Vf \qquad (2)$$

In the same manner as in the second and third modification examples, the voltage VG2 is maintained higher than, for example, the threshold voltage of the switch element NTOUT2, and the switch element NTOUT2 is maintained in the ON state.

Such a configuration can produce basically the same effects as in the second and third modification examples.

2.5 Modification Example 5

In the example of the embodiment, the voltage monitor circuit 14 monitors the voltage VG, and outputs a signal S3 based on the monitored voltage VG. The configuration of the voltage monitor circuit 14 is not limited thereto, however. The voltage monitor circuit 14 may include the following configuration.

Figure 10:
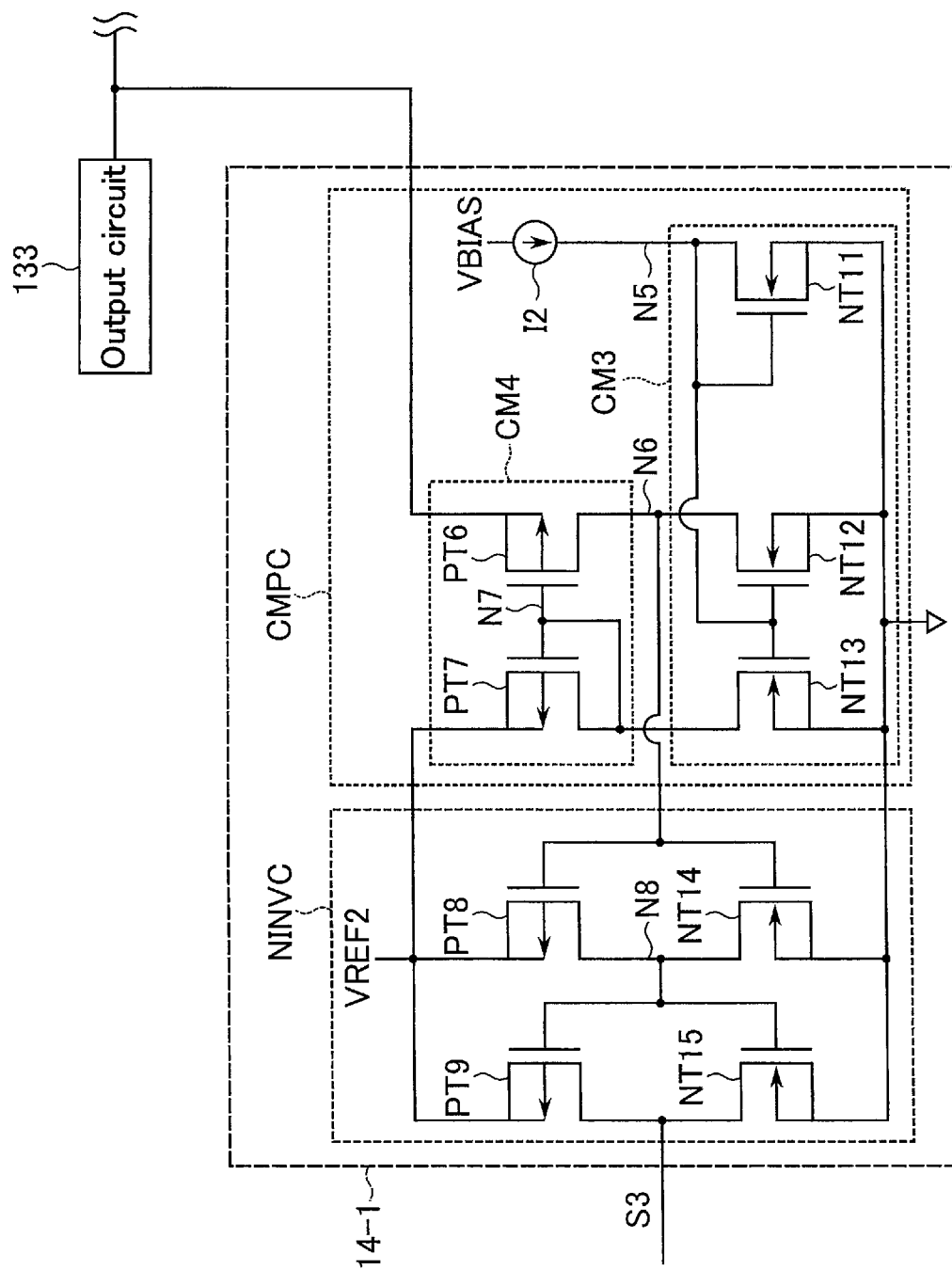
FIG. 10 is a circuit diagram for explaining an exemplary configuration of a voltage monitor circuit of a semiconductor device according to a fifth modification example.

A semiconductor device 1 according to the fifth modification example will be explained with reference to FIG. 10, which is a circuit diagram for explaining an exemplary configuration of the voltage monitor circuit 14 in the semiconductor device 1 according to the fifth modification example. The configuration of the voltage monitor circuit 14-1 is illustrated in FIG. 10, and is explained below. For the configuration of the voltage monitor circuit 14-2, its portions similar to those of the voltage monitor circuit 14-1 will be omitted from the explanation, and portions that differ from those of the voltage monitor circuit 14-1 will be mainly explained.

The voltage monitor circuit 14 according to the fifth modification example includes a comparator circuit CMPC and a non-inverting circuit NINVC.

The comparator circuit CMPC generates a signal based on the comparison result of the voltage VG at the gate of the switch element NTOUT and a reference voltage described later. The non-inverting circuit NINVC generates a non-inverted signal of the signal generated by the comparator circuit CMPC. The generated non-inverted signal is output to the second input end of the OR circuit 131 of the drive circuit 13.

The comparator circuit CMPC includes a constant current source 12, a current mirror CM3, and a current mirror CM4.

The constant current source 12 is coupled to a node N5. A voltage VBIAS, for example, is input to the constant current source 12. The constant current source 12 outputs to the node N5 a current based on the input voltage VBIAS.

The current mirror CM3 includes switch elements NT11, NT12 and NT13, which are N-channel MOSFETs. The channels of the switch elements NT11, NT12 and NT13 have approximately the same W/L ratio of width W and length L.

The first end of the switch element NT11 is, together with the gate of the switch element NT11, coupled to the node N5. The second end of the switch element NT11 is grounded.

The first end of the switch element NT12 is coupled to the node N6. The second end of the switch element NT12 is grounded. The gate of the switch element NT12 is, together with the first end of the switch element NT11 and the gate of the switch element NT11, coupled to the node N5.

The first end of the switch element NT13 is coupled to the node N7. The second end of the switch element NT13 is grounded. The gate of the switch element NT13 is coupled to the node N5, commonly with the first end of the switch element NT11, the gate of the switch element NT11 and the gate of the switch element NT12.

With the above configuration of the current mirror CM3, the current flowing to the switch elements NT12 and NT13 is generated based on the current of the constant current source 12 flowing to the switch element NT11. The switch elements NT11, NT12 and NT13 have approximately the same W/L ratio as mentioned above, and therefore the amounts of current flowing to the switch elements NT11, NT12 and NT13 are approximately the same as one another.

The current mirror CM4 includes switch elements PT6 and PT7, which are P-channel MOSFETs. The channels of the switch elements PT6 and PT7 have approximately the same W/L ratio of the width W and length L.

The first end of the switch element PT6 is coupled to the gate of the switch element NTOUT1. In the voltage monitor circuit 14-2, which is not shown in the drawing, the first end of the switch element PT6 is coupled to the gate of the switch element NTOUT2. The second end of the switch element PT6 is coupled to the node N6. The gate of the switch element PT6 is coupled to the node N7.

A reference voltage VREF2 is input to the first end of the switch element PT7. The reference voltage VREF2 is lower than the voltage V1 of the boost circuit 12. The reference voltage VREF2 is supplied, for example, from the source of voltage inside the semiconductor device 1, which differs from the source of the voltage VBIAS or reference voltage VREF1. This is not a limitation, however. The reference voltage VREF2 may be supplied from the same source of voltage as that of the voltage VBIAS, or from the same source of voltage as the reference voltage VREF1. The reference voltage VREF2 may be a voltage VIN. The second end of the switch element PT7 is, together with the gate of the switch element PT7, coupled to the node N7.

With the above configuration of the current mirror CM4, a current to the switch element PT6 is generated based on the current flowing through the switch element PT7. Since the switch elements PT6 and PT7 have the same W/L ratio as mentioned above, the current flowing through the switch element PT6 is larger than the current flowing through the switch element PT7 when the voltage VG at the gate of the switch element NTOUT is higher than the reference voltage VREF2. On the other hand, when the voltage VG is lower than or equal to the reference voltage VREF2, the current flowing through the switch element PT6 is smaller than or equal to the current flowing through the switch element PT7.

With the above configuration of the comparator circuit CMPC, when the voltage VG is higher than the reference voltage VREF2, the voltage at the node N6 (hereinafter also referred to as the "signal of the comparator circuit CMPC") is at the "H" level. When the voltage VG is lower than the reference voltage VREF2, the signal of the comparator circuit CMPC is at the "L" level (the voltage of the node N6 falls to the ground voltage VSS).

The non-inverting circuit NINVC includes switch elements NT14, NT15, PT8 and PT9. The switch elements NT14 and NT15 are N-channel MOSFETs, and the switch elements PT8 and PT9 are P-channel MOSFETs.

To the first end of the switch element PT8 is input a reference voltage VREF2. The second end of the switch element PT8 is coupled to the node N8, and the gate of the switch element PT8 is coupled to the node N6.

The first end of the switch element NT14 is coupled to the node N8, and the second end of the switch element NT14 is grounded. The gate of the switch element NT14 is coupled to the node N6.

To the first end of the switch element PT9 is input a reference voltage VREF2. The second end of the switch element PT9 is coupled to the second input end of the OR circuit 131 of the drive circuit 13-1, and outputs the signal S3. The gate of the switch element PT9 is coupled to the node N8.

The first end of the switch element NT15 is coupled to the second input end of the OR circuit 131 of the drive circuit 13-1, and the second end of the switch element NT15 is grounded. The gate of the switch element NT15 is coupled to the node N8.

With the above configuration, when the voltage VG at the switch element NTOUT is higher than or equal to the reference voltage VREF2, the signal S3 is at the "H" level based on the "H"-level signal of the comparator circuit CMPC, while when the voltage VG at the switch element NTOUT is lower than the reference voltage VREF2, the signal S3 is at the "L" level based on the "L"-level signal of the comparator circuit CMPC.

The operation of the fifth modification example will be explained. The operation of the fifth modification example is basically the same as the operation of the embodiment except for the values of the voltage VG at times T2 and T6 according to the embodiment. In the following explanation, the values of the voltage VG at times T2 and T6 will be mainly discussed, and other portions will be omitted from the explanation.

At time T2, when the voltage VG reaches the reference voltage VREF2 or higher, the voltage monitor circuit 14 changes the signal S3 from the "L" level to the "H" level.

At time T6, when the voltage VG1 falls below the reference voltage VREF2, the voltage monitor circuit 14 changes the signal S3 from the "H" level to the "L" level.

Other operations are the same as those of the embodiment, and therefore the explanation is omitted.

With the above configuration, the same effects as in the embodiment can be produced.

The voltage monitor circuit 14 according to the fifth modification example may include the automatic recovery circuit 141 according to the second modification example, or the automatic recovery circuit 141 according to the third modification example. In this case, the second end of the resistor R5 of the automatic recovery circuit 141 is coupled to the output end of the output circuit 133 of the drive circuit 13 and to the first end of the switch element PT6. The aforementioned voltage VRT1 is set higher than the reference voltage VREF2.

The semiconductor device 1 according to the fifth modification example may include the automatic recovery circuit 141 according to the second modification example or the automatic recovery circuit 141 according to the third modification example, and the output circuit 133 of the semiconductor device 1 according to the fifth modification example may include the same configuration as that of the output circuit 133 according to the fourth modification example. In this case, the above voltage VRT2 is set higher than the reference voltage VREF2.

In the fifth modification example, the voltage monitor circuit 14 includes a comparator circuit CMPC. The configuration of the voltage monitor circuit 14, however, is not limited thereto. The voltage monitor circuit 14 may include a known comparator circuit. In this case, the comparator circuit compares the voltage at the output end of the output circuit 133 with a reference voltage, and the voltage monitor circuit 14 generates a signal S3 based on the result of the comparison. In particular, the voltage monitor circuit 14-1 of FIG. 10 includes a known comparator circuit, in place of the comparator circuit CMPC, and a signal based on the result of the comparison obtained by this comparator circuit may be input to the gate of the switch element PT8 and the gate of the switch element NT14.

3. OTHERS

The embodiments of the present invention have been explained. These are presented merely as examples and are not intended to restrict the scope of the invention. These embodiments may be realized in various other forms, and various omissions, replacements, and changes can be made without departing from the gist of the invention. Such embodiments and modifications are included in the scope and gist of the invention, and are included in the scope of the invention described in the claims and its equivalents.

The invention claimed is:

1. A semiconductor device comprising:
a first circuit configured to generate a first voltage;
a second circuit configured to transfer the generated first voltage to a first terminal;
a third circuit configured to generate a first signal that demonstrates a first level when a voltage at the first terminal is higher than or equal to a threshold voltage, and a second level when the voltage of the first terminal is lower than the threshold voltage;
a first switch element; and
a first resistor, wherein
the third circuit comprises:
  a second switch element including a first end to which a second voltage is input, a second end that is grounded, and a gate to which a voltage based on the voltage of the first terminal is input;
  a third switch element including a first end coupled to the first end of the second switch element, a second end coupled to the second circuit, and a gate coupled to the first end of the second switch element; and
  a fourth switch element including a first end coupled to the second end of the third switch element, a second end that is grounded, and a gate coupled to the first end of the second switch element;
the first switch element has a first end coupled to the first terminal, a second end coupled to the gate of the second switch element, and a gate,
a first resistor has a first end and a second end that is grounded, the first end being coupled to the gate of the second switch element and to the second end of the first switch element,
the second circuit is configured to interrupt transfer of the first voltage, based on the first signal at the second level, and
the third circuit outputs the first signal to the second circuit, based on a voltage at the second end of the third switch element and a voltage at the first end of the fourth switch element.

2. A semiconductor device comprising:
a first circuit configured to generate a first voltage;
a second circuit configured to transfer the generated first voltage to a first terminal; and
a third circuit configured to generate a first signal that demonstrates a first level when a voltage at the first terminal is higher than or equal to a threshold voltage, and a second level when the voltage of the first terminal is lower than the threshold voltage, wherein
the third circuit comprises:
  a first switch element having a first end coupled to a first current source, a second end that is grounded, and a gate coupled, together with the first end, to the first current source;
  a second switch element having a first end coupled to the first node, a second end that is grounded, and a gate coupled to the first current source;
  a third switch element having a first end coupled to a second node, a second end that is grounded, and a gate coupled to the first current source;
  a fourth switch element having a first end to which a voltage based on the voltage of the first terminal is input, a second end coupled to the first node, and a gate coupled to the second node;
  a fifth switch element having a first end to which a second voltage is input, a second end coupled to the second node, and a gate coupled, together with the second end, to the second node;
  a sixth switch element having a first end coupled to the first end of the fifth switch element, a second end coupled to a third node, and a gate coupled to the first node;
  a seventh switch element having a first end coupled to the second end of the sixth switch element, a second end that is grounded, and a gate coupled to the first node;
  an eighth switch element having a first end coupled to the first end of the fifth switch element and to the first end of the sixth switch element, a second end coupled to the second circuit, and a gate coupled to the third node; and
  a ninth switch element having a first end coupled to the second end of the eighth switch element, a second end that is grounded, and a gate coupled to the third node,
the second circuit is configured to interrupt transfer of the first voltage, based on the first signal at the second level, and
the third circuit outputs the first signal to the second circuit, based on a voltage at the second end of the eighth switch element and a voltage at the first end of the ninth switch element.

3. A semiconductor device comprising:
a first circuit configured to generate a first voltage;
a second circuit configured to transfer the generated first voltage to a first terminal;
a third circuit configured to generate a first signal that demonstrates a first level when a voltage at the first terminal is higher than or equal to a threshold voltage, and a second level when the voltage of the first terminal is lower than the threshold voltage;
a first voltage source capable of outputting a second voltage; and
a first resistor serially coupling the first voltage source and the first terminal, wherein
the second circuit is configured to interrupt transfer of the first voltage, based on the first signal at the second level,
a second signal is input to the first voltage source, the second signal demonstrating a third level or a fourth level that differs from the third level, and the first voltage source outputs the second voltage to the first resistor, based on the second signal at the third level.

4. The device of claim 3, wherein
the first voltage source comprises:
   a first element; and
   a first switch element having a first end to which the second voltage is input, a second end coupled to the first element, and a gate to which the second signal is input, and
the first element serially couples the first resistor and the first switch element.

5. The device of claim 3, wherein
the first voltage source comprises:
   a first element;
   a fourth circuit having a first end to which the second signal is input, and a second end from which a third signal is output based on the second signal; and
   a first switch element having a first end to which the second voltage is input, a second end coupled to the first element, and a gate to which the third signal is input, and
the first element serially couples the first resistor and the first switch element.

6. The device of claim 3, wherein
the second circuit is configured to establish a ground for the first terminal based on the second signal at the fourth level.

7. The device of claim 3, further comprising:
a fourth circuit configured to output the second signal in response to a command transmitted from outside.

8. A semiconductor device comprising:
a first circuit configured to generate a first voltage;
a second circuit configured to transfer the generated first voltage to a first terminal; and
a third circuit configured to generate a first signal that demonstrates a first level when a voltage at the first terminal is higher than or equal to a threshold voltage, and a second level when the voltage of the first terminal is lower than the threshold voltage, wherein
the second circuit is configured to interrupt transfer of the first voltage, based on the first signal at the second level,
the second circuit comprises:
   a fourth circuit configured to generate a second signal based on the first signal; and
   a fifth circuit configured to interrupt transfer of the generated first voltage to the first terminal, based on the second signal generated based on the first signal at the second level.

9. The device of claim 8, wherein
the fifth circuit is configured to establish a ground for the first terminal based on the second signal generated based on the first signal at the second level.

10. The device of claim 8, wherein
the fifth circuit comprises:
   a sixth circuit configured to supply a first current to the first terminal; and
   a seventh circuit configured to supply a second current to the first terminal,
wherein, based on the second signal generated based on the first signal at the second level, the sixth circuit is configured to interrupt supply of the first current, and the seventh circuit is configured to interrupt supply of the second current.

11. The device of claim 10, wherein
the sixth circuit comprises a first switch element having an input end to which the first voltage is applied, and an output end coupled to the first terminal, the first current being output from the output end of the first switch element,
the seventh circuit comprises a second switch element having an input end to which the first voltage is applied, and an output end coupled to the first terminal, the second current being output from the output end of the second switch element, and
a resistance value of the first switch element in an ON state is larger than a resistance value of the second switch element in an ON state.

* * * * *